United States Patent
Mirgorodski et al.

(10) Patent No.: US 8,554,529 B2
(45) Date of Patent: Oct. 8, 2013

(54) BLACK BOX MODEL FOR LARGE SIGNAL TRANSIENT INTEGRATED CIRCUIT SIMULATION

(75) Inventors: Yuri Mirgorodski, Sunnyvale, CA (US); Peter J. Hopper, San Jose, CA (US); William French, San Jose, CA (US); Philipp Lindorfer, San Jose, CA (US)

(73) Assignee: Texas Instruments Incorporated, Dallas, TX (US)

(*) Notice: Subject to any disclaimer, the term of this patent is extended or adjusted under 35 U.S.C. 154(b) by 719 days.

(21) Appl. No.: 11/998,478

(22) Filed: Nov. 30, 2007

(65) Prior Publication Data
US 2009/0144035 A1 Jun. 4, 2009

(51) Int. Cl.
*G06F 17/50* (2006.01)

(52) U.S. Cl.
USPC .............................................................. 703/14

(58) Field of Classification Search
USPC .............................................................. 703/14
See application file for complete search history.

(56) References Cited

U.S. PATENT DOCUMENTS

| | | | | |
|---|---|---|---|---|
| 6,369,601 B1 * | 4/2002 | Ishigaki | | 324/765 |
| 6,807,509 B2 * | 10/2004 | Bourdin et al. | | 702/125 |
| 2004/0138866 A1 * | 7/2004 | Harjung | | 703/14 |
| 2007/0043548 A1 * | 2/2007 | Arevalo et al. | | 703/14 |

OTHER PUBLICATIONS

Maggioni et al. "Random Sampling for On-chip Characterization of Standard-Cell Propagation Delay", Aug. 2003, IEEE, Proceedings of teh Fourth International Symposium on Quality Electronic Design, 5 pages.*

* cited by examiner

*Primary Examiner* — Suzanne Lo
(74) *Attorney, Agent, or Firm* — Michael A. Davis, Jr.; W. James Brady; Frederick J. Telecky, Jr.

(57) ABSTRACT

A method of simulating an integrated circuit device under test (DUT) is provided, wherein the DUT includes a plurality of terminals. For each terminal of the DUT, a probe pulse is applied to the terminal and a reaction is recorded at the terminal and each of the other terminals to obtain values representative of reactive tails for the terminal. For each terminal, the values representative of the reactive tails obtained for the terminal are stored as an entry of a look-up table. Each entry includes n+x fields, wherein n represents a number of arguments in the entry and x represents a number of functions in the entry. For each terminal, a signal value at a selected time step is calculated.

9 Claims, 2 Drawing Sheets

SOLID - MEDIC'S
DASHED - ICOS MODEL
SQUARES - REV.0 BSIM3

BLACK BOX MODEL FOR LARGE SIGNAL TRANSIENT INTEGRATED CIRCUIT SIMULATION

FIELD OF THE INVENTION

The present invention relates to semiconductor integrated circuits and, in particular, to techniques for generating compact circuit simulation models based only upon external steady-state and transient characteristics of a device under test (DUT).

DISCUSSION OF THE RELATED ART

Integrated circuit simulation utilizes mathematical models to replicate the behavior of an actual integrated circuit design. Simulating a circuit's behavior before actually building it greatly improves efficiency and provides insights into the operational behavior and the stability of the circuit design.

Contemporary integrated circuit simulation models include two basic types. One type of simulation model is based upon a detailed understanding of device physics and involves a set of parameters to be extracted from experimental data. A major issue with this type of modeling is that it requires a complicated procedure for parameter extraction that is time consuming and cannot be fully automated. Also, for any new device type, a model first has to be developed and tested for accuracy.

A second type of simulation model utilizes a collection of external current-voltage (I-V), capacitance-voltage (C-V), and/or inductance-voltage (L-V) curves covering the operating regions of the circuit design ("black box" and "look-up table" approaches). This approach typically requires large computer resources to store all of the information needed for the simulation.

Both of these modeling approaches have serious limitations. If any model parameter is frequency dependant, then the model can be used only in direct current (DC) and small signal frequency analysis. It cannot be used in large signal frequency analysis or in a general transient analysis, which is the most common type of circuit simulation and particularly important for power simulations.

SUMMARY OF THE INVENTION

In accordance with the present invention, a circuit model is provided that is applicable to any device type. The technique is based upon the "black box" approach utilizing look-up tables, but extends the "black box" approach to the domain of general transient large signal analysis utilizing "reactive tails."

Thus, the present invention provides a method of simulating an integrated circuit device under test (DUT) that includes a plurality of terminals. For each terminal of the DUT, a probe pulse is applied to the terminal and a reaction at the terminal and at each of the other terminals is recorded to obtain reactive tails for that terminal. For each terminal, the reactive tails obtained for that terminal are stored in an entry of a look-up table. Each entry in the look-up table includes n+x fields, wherein n represents a number of arguments in that entry and x represents a number of functions in that entry. For each terminal, a signal value is calculated for a selected time step.

The invention provides generalized hierarchical behavioral modeling for traditional MOS and bipolar transistors and for new devices (e.g., power inductors) and for any sub-circuit with a small number of inputs and outputs (e.g., power array). It provides efficient circuit simulation with auto-generated RTM of sub-circuit blocks.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

A simulation methodology in accordance with the present invention is described in detail below. The data to be collected is discussed first, followed by a discussion of how the collected data is utilized in accordance with the concepts of the invention.

The operating area of a device under test (DUT) is covered with data points. Each data point includes steady-state voltages and currents for all device terminals. It also includes so-called "reactive tails." To obtain the "reactive tails," a probe pulse is applied to each terminal of the DUT and a reaction on the same and other terminals is recorded as a function of time. The "reactive tails" present the reaction of one terminal to a probe pulse applied to another terminal. The total number of "tails" per data point is equal to n**2, where n is the total number of terminals of the DUT.

Figure 1:
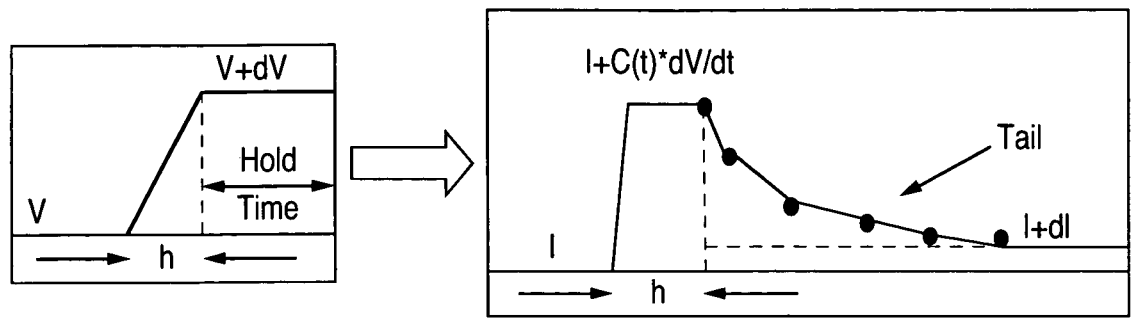
FIG. 1 illustrates the shape of a probe pulse and a time dependant reaction.

The probe pulse may be a voltage pulse or a current pulse or a combination of voltage/current, depending upon the nature of the device (i.e., voltage pulse for a capacitor and current pulse for an inductor). The shapes of a pulse and a time dependent reaction are shown in FIG. 1. Preferably, the amplitude of a pulse is small. The pulse includes a rise time portion with linear dependence of the signal on time, and a hold time portion where the signal is constant. The rise time must be short, that is, as short as the minimal time step expected to appear in the circuit simulation. The choice of the probe pulse is dictated by the fact that all known circuit simulator tools utilize the assumption about small change of any variable over a time step, i.e., an almost linear behavior within a time step. The hold time should be long enough to allow the tail essentially to decay and become an exponential tail. A tail is only a portion of a time dependent reaction that corresponds to hold time; information related to rise time is not needed. Also, only the difference between steady-state and time-domain values constitutes a tail. The tails can be normalized to the amplitude of the probe pulse. Thus, they would have a physical nature of time dependent capacitances/inductances. It is important to remember that the tails are dependent upon rise time.

The concept of the present invention that is used to extend the conventional black box model to general time-domain simulation is based upon the fact that any input signal on a terminal can be treated as a combination of probe pulses used as discussed above for device characterization. The corresponding linear combination of "reactive tails" represents the total reaction of the DUT to the input signal. This concept is valid for any device with linear characteristics (i.e. resistance/capacitance is not dependent on voltage/current). Therefore, the model is accurate for such devices (i.e. introduces only numerical inaccuracy—not physical). For non-linear devices, the model is practically accurate only if all the tails decay faster then a device comes to an essentially different electrical regime.

To describe the model, it is assumed that all the data points are collected and stored in so-called "look-up tables." The "n" columns (typically steady-state voltages or currents) represent arguments; the rest are functions. Any data between stored points are available through standard algorithms of interpolation/extrapolation (i.e. splines).

The model allows for calculating all the functions for any given set of argument values at any time. For the simplicity, voltages are used as the arguments and currents are used as the functions. A typical circuit simulator performs calculations by time steps. A calculation algorithm for any time step is described below. The current at any terminal is a sum of steady-state and time-dependent components. The steady-state component comes directly from the look-up table utilizing an interpolation technique. A time-dependent component at a terminal is a sum of contributions coming from all the terminals.

A contribution of one terminal (A) to another terminal (B) is a sum of tails resulting from all previously calculated time steps and from the current step (practically, only limited "past" should be considered that depends on how fast the tails decay). The tails should correspond to probe pulse applied to terminal A and measured on terminal B. If normalized tails are used, then the current should be calculated by multiplying the normalized tail by the derivative of voltage with respect to time (alike capacitive current).

Each tail should be calculated as originated with rise time equal to time step. Since a look-up table contains only minimal possible rise time data, the tails for larger times should be properly calculated. This can be easily done based upon the fact that any long probe pulse is a combination of short probe pulses. It can be done either "on the fly" or prior to simulation and stored, which is a compromise between required memory and speed.

Usually a device is surrounded by other circuit elements. In that case, time dependent voltages applied to the terminals are not available prior to simulation. For this situation, the disclosed method at any time step results in one equation per terminal that has to be solved together with other circuit equations.

It should be mentioned that the proposed model becomes equivalent to the traditional method when the tail decay time is essentially smaller than the time steps. In that case, only a newly originated tail initial value is used. This value does not depend on time step (large rise time) and represents regular capacitance.

Figure 2A:
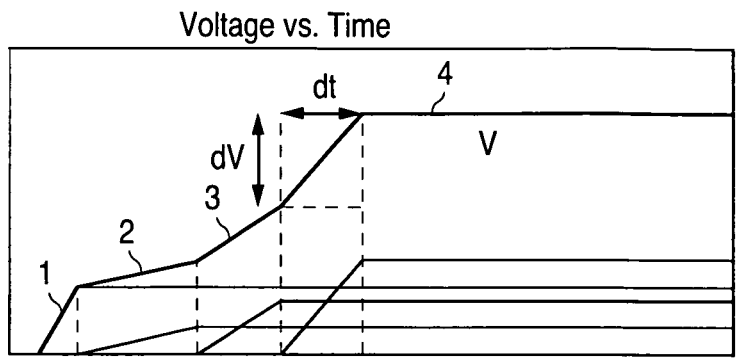
FIGS. 2A and 2B illustrate how "reactive tails" are utilized in accordance with the concepts of the present invention.
Figure 2B:
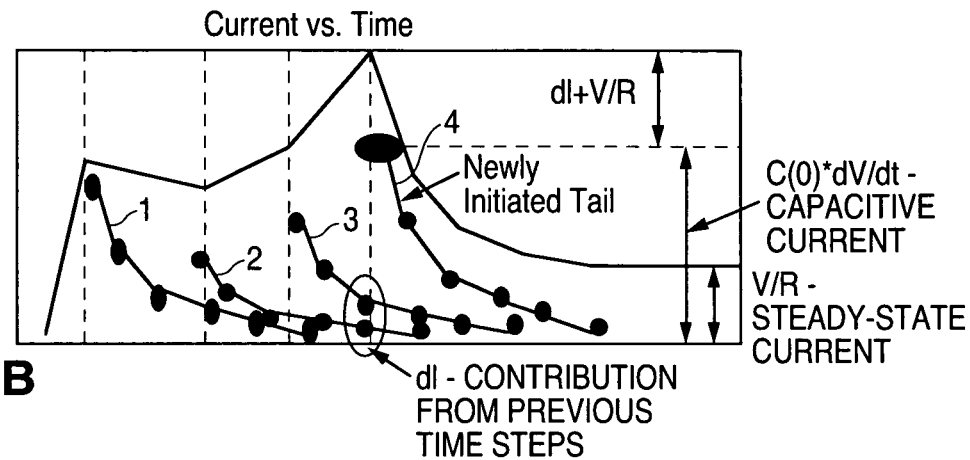

FIGS. 2A and 2B illustrate how the "reactive tails" are utilized in accordance with the concepts of the present invention. As discussed above, to calculate current, at every time step during circuit simulation, one should summate the steady-state current, the contribution from previous time steps, and the contribution of the newly initiated tail.

Figure 3:
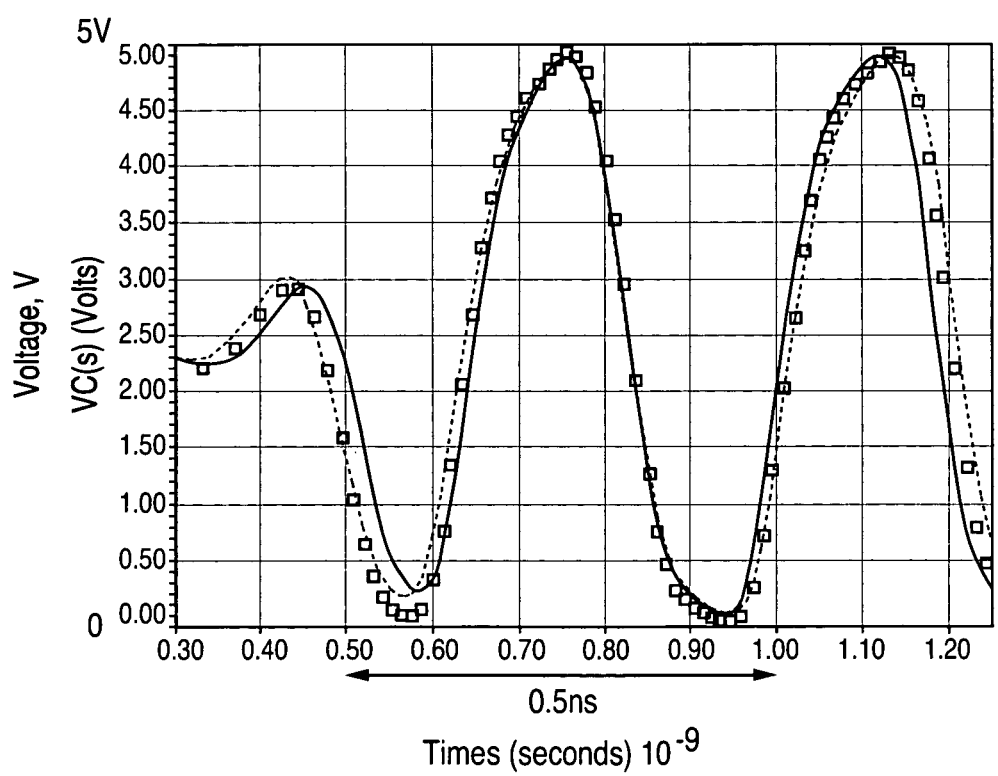
FIG. 3 provides a flow chart of an embodiment of a method of simulating an integrated circuit device under test in accordance with the concepts of the present invention.

FIG. 3 provides a flow chart of an embodiment of a simulation method in accordance with the present invention.

Figure 4:
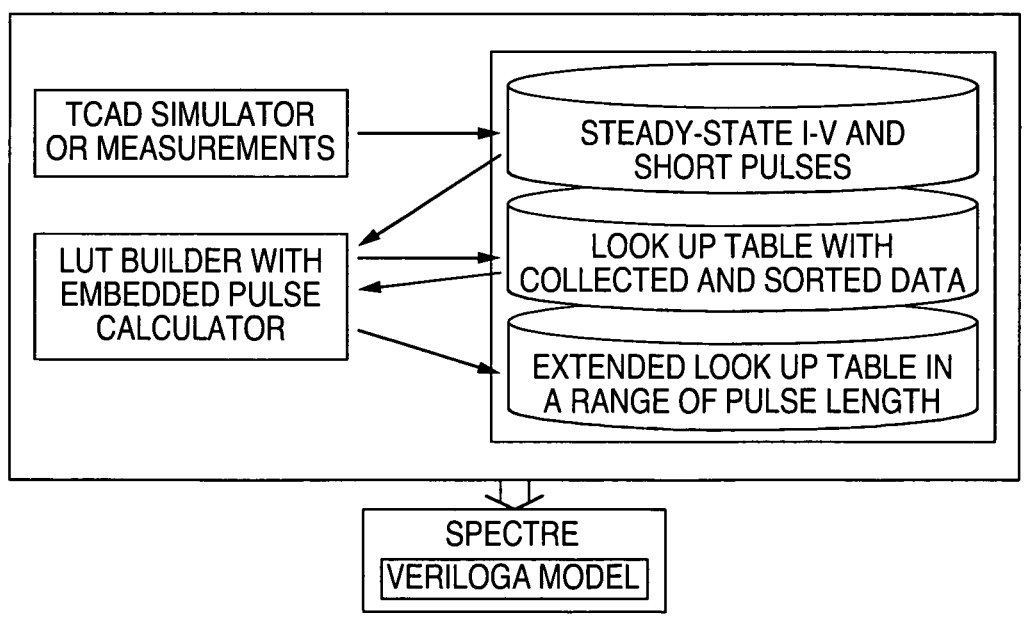
FIG. 4 illustrates ring oscillator voltage as a function of time.

As an illustration, in FIG. 3, a ring oscillator stage voltage is presented as a function of time. As shown in the FIG. 4 flow chart, the ring oscillator stage was simulated with TCAD device simulator Medici, with the model implemented in Spectre with VerilogA, and with Rev0 BS1M3 model. The input data for both new model and Rev0 BS1M3 model were obtained from single NMOS and PMOS simulation with same Medici.

It should be understood that the particular embodiments of the invention described above have been provided by way of example and that other modifications may occur to those skilled in the art without departing from the scope and spirit of the invention as express in the appended claims and their equivalents.

What is claimed is:

1. A method of simulating an integrated circuit device under test ("DUT"), wherein the DUT includes at least first and second terminals, the method comprising:
    applying first and second probe pulses to the first and second terminals, respectively, and recording time-dependent reactions of the first and second terminals in response thereto, wherein the time-dependent reactions have decay times and are recorded in table entries that store information about the first and second probe pulses;
    using the table entries to calculate, by a device, first reactions of the first and second terminals in response to values of the first and second terminals at a first time step; and
    using the table entries to calculate, by the device, second reactions of the first and second terminals in response to values of the first and second terminals at a second time step;
    wherein at least one of the first reactions has a respective decay that is longer than the first time step and continues during the second time step and contributes to at least one of the second reactions;
    wherein the first and second reactions include steady-state components and time-dependent components;
    wherein using the table entries to calculate the steady-state components of the second reactions includes performing interpolation from the table entries in response to the values of the first and second terminals at the second time step; and
    wherein using the table entries to calculate the time-dependent components of the second reactions includes performing summation from the table entries in response to the values of the first and second terminals at the second time step and in response to the first reactions.

2. The method of claim 1, wherein the first and second probe pulses include first and second voltage pulses, respectively.

3. The method of claim 1, wherein the first and second probe pulses include first and second current pulses, respectively.

4. The method of claim 1, wherein:
    the first reactions include a first reaction of the second terminal in response to a value of the first terminal at the first time step; and
    the second reactions include a second reaction of the second terminal in response to a value of the first terminal at the second time step.

5. The method of claim 4, wherein the first reaction of the second terminal has a respective decay that continues during the second time step and contributes to the second reaction of the second terminal.

6. The method of claim 1, wherein the first probe pulse includes a rise time portion having linear dependence on time and a hold time portion that is constant.

7. The method of claim 1, wherein the time-dependent reactions include reactions of currents at the first and second terminals.

8. The method of claim 1, wherein applying the first and second probe pulses includes:
applying the first probe pulse to the first terminal, and recording first time-dependent reactions of the first and second terminals in response thereto; and applying the second probe pulse to the second terminal, and recording second time-dependent reactions of the first and second terminals in response thereto.

9. The method of claim 1, wherein applying the first and second probe pulses includes:
applying the first probe pulse to the first terminal; and, after recording the time-dependent reactions in response to the first probe pulse, applying the second probe pulse to the second terminal.

* * * * *